United States Patent [19]

Kurokawa et al.

[11] Patent Number: 5,349,653
[45] Date of Patent: Sep. 20, 1994

[54] APPARATUS FOR CONVERTING PARALLEL BITS OF AN ELECTRICAL DATA SIGNAL INTO SERIAL BITS OF AN OPTICAL DATA SIGNAL UTILIZING AN OPTICAL TIME DELAY

[75] Inventors: Hiroshi Kurokawa, Kodaira; Yasushi Takahashi, Hachioji; Yasuhiro Inagami, Kodaira, all of Japan

[73] Assignee: Hitachi, Ltd., Tokyo, Japan

[21] Appl. No.: 775,030

[22] Filed: Oct. 11, 1991

[30] Foreign Application Priority Data

Oct. 12, 1990 [JP] Japan .................................. 2-272154

[51] Int. Cl.$^5$ .............................................. G06F 5/00
[52] U.S. Cl. ............................... 395/500; 364/952.31; 364/939.5; 364/271.5; 364/271; 364/DIG. 2; 341/101; 395/800
[58] Field of Search ............... 395/800, 500; 341/101; 385/16; 364/713

[56] References Cited

U.S. PATENT DOCUMENTS

| | | | |
|---|---|---|---|
| 4,847,613 | 7/1989 | Sakurai | 340/825.21 |
| 4,860,287 | 8/1989 | Kelly | 370/108 |
| 4,961,621 | 10/1990 | Su | 350/96.16 |
| 5,172,260 | 12/1992 | Takatsu | 359/176 |
| 5,247,652 | 9/1993 | Uda | 395/500 |

FOREIGN PATENT DOCUMENTS 62-10934A 1/1987 Japan .
1256846A 10/1989 Japan .

OTHER PUBLICATIONS

*Journal of Lightwave Technology*, "Optical Time-Division Multiplexing for Very High Bit-Rate Transmission" R. S. Tucker et al., vol. 6, No. 11, Nov. 1988.
*Electronics Letters*, "Optical Time-Division Multiplexed Transmission at 8 Gbit/s Using Single Laser and Semiconductor Optical Power Amplifier", Aug. 1989, vol. 25, No. 16, 3rd.

*Primary Examiner*—Eric Coleman
*Attorney, Agent, or Firm*—Antonelli, Terry, Stout & Kraus

[57] ABSTRACT

A plurality of electric data signals representing parallel data bits are applied to a plurality of gates or control terminals on-off controlling optical switches, respectively. A single pulsed synchronizing signal is distributed to input terminals of the plurality of gates or the optical switches. Synchronizing signals, which have passed through gates or optical switches, which are in an ON state, among the plurality of gates or the optical switches are coupled to synchronize finally an optical signal. In this way a serial optical pulsed output signal can be obtained by utilizing optical delay in a process for distributing the synchronizing signals or a process for coupling the synchronizing signals.

39 Claims, 10 Drawing Sheets

APPARATUS FOR CONVERTING PARALLEL BITS OF AN ELECTRICAL DATA SIGNAL INTO SERIAL BITS OF AN OPTICAL DATA SIGNAL UTILIZING AN OPTICAL TIME DELAY

BACKGROUND OF THE INVENTION

The present invention relates to a parallel-serial translator, and more in detail to a device, which translates electric signals inputted in parallel into parallel-serial-translated optical signals to send them to an optical waveguide.

For a computer, and in particular for a computer called a vector computer, it is extremely important for improving the performance of the computer to raise the capacity (amount of data which can be transmitted per unit time) of a data interconnecting line disposed between a main storage and a vector processor. Since the main storage has, in general, a speed lower than that of the vector processor, in many cases, in order to increase the transmission capacity the computer is so constructed that the main storage is divided into a plurality of memory banks driven parallelly, which can be accessed independently from each other (it is called interleave). Further, the speed of the vector processor is increased every time a new model is put on the market. Therefore, an increase in the speed of memories constituting the main storage cannot follow the increase in the speed of the vector processor. For this reason, the newer the model is, the greater the number of memory banks driven in parallel is. Although the number of memory banks is about 512 at present, it is thought that increases in the future such as 1024, 2048, etc. is likely.

When the number of memory banks increases, it becomes important to reduce the size of the interconnecting line connecting the main storage with the memory banks. For example, when data signal lines, each of which has a data width of 8 bytes (64 bits), are taken out from 512 memory banks as in a vector computer indicated in FIG. 1, 32768 data signal lines are connected between the main storage and the vector processor. Even if it is supposed that the cross-section of one signal line is as small as 1 mm$^2$, an area of about 18 cm square is required for connecting all the data signal lines. This area is almost identical to that of an LSI mounting module constituting the vector processor. In order to increase further the number of memory banks, it is necessary to increase the capacity of the interconnecting line and to decrease the size thereof. A decrease in the size of the interconnecting line is important also for locating the vector processor closely to the main storage to shorten transmission time.

For increasing the capacity of the interconnecting line and decreasing the size thereof a method is known, by which a plurality of signals are parallel-serial-translated to be transmitted through one signal line (time slice multiplexing, hereinbelow in the present specification this process is sometimes abbreviated to P/S translation) and further optical fibers are used as a transmission medium, which has a smaller diameter and a higher transmission bit rate than a coaxial cable.

As an example therefor, there is known a transmitting device for great distance communication utilizing optical fibers used in practice in the field of communication. Here, FIG. 2 shows an example of construction of a vector computer, in which data read-out from a memory bank constituting the main storage are translated into an optical serial signal by using the parallel-serial translating technique used in the field of communication, which are transmitted to a vector processing unit. In order to simplify the explanation, here it is supposed that the data width is 8 bits and only signals concerning processing for reading out main storage data are described therein. FIG. 3 shows operation timing therefor. A vector processing unit 220 transmits an access control signal responding to an address to be accessed to a predetermined memory bank. The selected memory bank 241 holds data signals 2 read-out from the memory in registers 61 to 68 by switching-over selectors 51 to 58 in synchronism with a setup signal 1 after having started processing for reading out data at predetermined addresses by using the access control signal 8 and takes out the signals one after another in synchronism with a clock signal 5 while shifting them bit by bit, which signals are converted into optical signals in an electro-optical signal converter 20 to generate an optical output signal 3. A vector processor selects optical signals sent from the memory bank, responding to predetermined addresses and then returns the optical serial signals to electric parallel signals, which are transmitted to the vector processing unit. Since it can be thought that an optical serial signal-electric parallel signal translator 232 effects reverse translation with respect to the electric parallel-optical serial signal translator indicated in FIG. 3 and therefore it can be easily analogized therefrom, explanation of the contruction and the operation thereof will be omitted.

In this construction, since an electric parallel-serial translator 6 and an electric-optical signal converter 20 incorporating shift registers 61 to 68 are added to each of the memory bank, it is necessary to decrease the size thereof.

As an example for making these shift registers 61 to 68 unnecessary, JP-A-62-10934 discloses a parallel-serial translator, which translates parallel data into serial data by utilizing transfer delay of optical data in an optical fiber. However, in JP-A-62-10934, although a construction for translating optical data inputted in parallel into serial optical data is disclosed, no concrete construction is disclosed for indicating how the parallel optical data are obtained, starting from the electric signal data inputted in parallel.

As another example, in which the transfer delay of optical data in the optical fiber is used, there is known JP-A-1-256846. However, JP-A-1-256846 discloses only a technique, by which optical packet signals coming one after another through a plurality of input lines are arranged in series in optical fibers serving as output lines by switching-over them by means of an N×M spatial switch and indicates no concrete construction indicating how the parallel optical data can be obtained from the electric signal data inputted in parallel.

Further, in either one of the literatures described above, no attention is paid to decreasing the size of the parallel-serial signal translator. A high speed and small size parallel-serial signal translator, i.e. electric signal-optical signal converting device, is required for utilizing optical waveguides such as optical fibers between the main storage and the vector processor and converting the electric signal data inputted in parallel into the serial optical data to transmit them.

SUMMARY OF THE INVENTION

An object of the present invention is to provide a high speed and small size parallel-serial signal translator.

Another object of the present invention is to provide a parallel-serial signal translator capable of effecting sure conversion while using a simple synchronizing signal.

Still another object of the present invention is to provide a parallel-serial signal translator suitable for being mounted on a board, on which integrated circuits are mounted.

The parallel-serial signal translator indicated in the present invention translates electric data signal inputted in parallel into serial optical signal. At this time, each of the electric signals inputted in parallel is used as an enable signal for switching means disposed for each of them for making pulsed synchronizing signals selectively pass through. Further each of serial optical signal data sets is generated by this synchronizing signal pulse.

Here optical switches may be used for these switching means and a pulsed optical signal may be used for the synchronizing signal.

Further the parallel-serial translation is effected correctly, if the difference between transfer delay times for different routes, through which the synchronizing signal is divided and then coupled again after having passed through different switching means, is equal to an interval of the transfer of the serial optical signal data and the values of the electric signals inputted in parallel are determined, when the synchronizing signals pass through the switching means. In this case the routes of the interconnecting lines producing time differences in the synchronizing signals can be matched with geometrical arrangement of the integrated circuits mounted on the board.

An optical waveguide such as an optical fiber, etc. has a signal bandwidth greater than that of an electric transmission line such as a coaxial cable, etc. and can transmit signals having a transmission bit rate of Tbps (tera bit/sec) order higher by more than three orders than signals having a transmission bit rate of Gbps (giga bit/sec) used for computers at present. For this reason, it has an advantage that, in the case where a plurality of pulsed optical signals are transmitted continuously, waveform of each of pulses does not become dull and they can be transmitted, neither outrunning the preceding pulse nor being outrun by the succeeding pulse.

According to the present invention, parallel pulsed signals are generated by using each of the electric data signals inputted in parallel as an enable signal for switching means disposed for each of them for making a pulsed synchronizing signal selectively pass through. Then the pulsed signals are coupled by making them pass through optical waveguides arranged so that transfer delay times of the optical waveguides from optical signal generating means, i.e. the different electro-optical signal converters, to a coupler differ from each other by more than a pulsewidth of the respective pulsed optical signals. Owing to the feature described above, since the different pulsed optical signals are not superposed on each other on the optical waveguide, the P/S translation can be realized by using optical signals. For the present invention attention should be paid to that pulsed optical signals are generated from a single pulsed synchronizing signal and distributed to the different switching means. Consequently adjustment of the pulsewidth of the optical signals, etc. can be effected easily by adjusting the pulsewidth of the single synchronizing signal.

The optical parallel-serial signal translator used for the present invention may be constructed by a plurality of optical waveguides having different transmission times and a coupler for optical signals transmitted therethrough. Since the bandwidth of these signals is great, it is possible to construct easily a wide band width and high speed parallel-serial signal translator. Further it is possible also to form the optical parallel-serial signal translator on a board, on which integrated circuits such as memories, etc. are mounted. For example, the difference in the transfer delay time between different optical signals, required in the case where optical signals are transmitted at 10 Gbps is 100 ps and the length of the optical fiber required for producing this difference is as small as 20 mm. Therefore there is no hindrance to mount it.

Furthermore, in a preferred mode of realization of the present invention pulsed light emitted by a pulsed light source may be divided and pulsed light beams thus obtained may be made to pass through a plurality of optical switches, which make them pass through or transfer them/cut off them, responding to the inputted signal, to be inputted in the coupler. Here attention should be paid to the point where the pulsed light is injected at a point of time, where the inputted data has been determined and the transfer/cut-off of the optical switches has been determined. For this reason the switching time (switching time from transfer to cut off or vise versa) of the optical switches is independent of the transmission interval of the signals. Further, since the various optical elements are arranged so that the transfer delay times of the optical waveguides from the pulsed optical source to the coupler through the optical switches are different by more than the pulsewidth of the pulsed optical signals, the pulsed optical signals, which have passed through the optical switches, can be coupled together without being superposed on each other.

Furthermore it is possible to form easily a parallel-serial signal translator on a board by forming the optical switches on the board, on which integrated circuits such as memories, etc. are mounted, putting pulsed light sources at one place and dividing the pulsed light therefrom. Still further, if the pulsed light is injected in a period of time, where the transfer/cut-off of the optical switches has been determined, since it is sufficient to realize that the difference in the transfer delay times of the optical waveguide from the pulsed optical source to the coupler through the optical switches is greater than the pulse-width of the pulsed optical signals, it is possible to form the optical switches at arbitrary positions on the interconnecting lines. For this reason, it is possible to produce the difference in the transfer delay time, by combining the optical switches and integrated circuits such as memories, etc. outputting signals controlling the transfer/cut-off of the optical switches in one set, different sets being arranged with a predetermined interval and by utilizing this interval. In this way the parallel-serial signal translator according to the present invention can be formed easily on the board by fitting appropriately the geometrical arrangement of the different parts of the parallel-serial signal translator.

BRIEF DESCRIPTION OF THE DRAWINGS

FIG. 11A indicating an example, in which sets, each of which includes a distributor and a coupler, are arranged with a constant interval on interconnecting lines; FIG. 11B indicating an example, in which the distributors and the couplers are gathered at one place.

DESCRIPTION OF THE PREFERRED EMBODIMENTS

Figure 1:
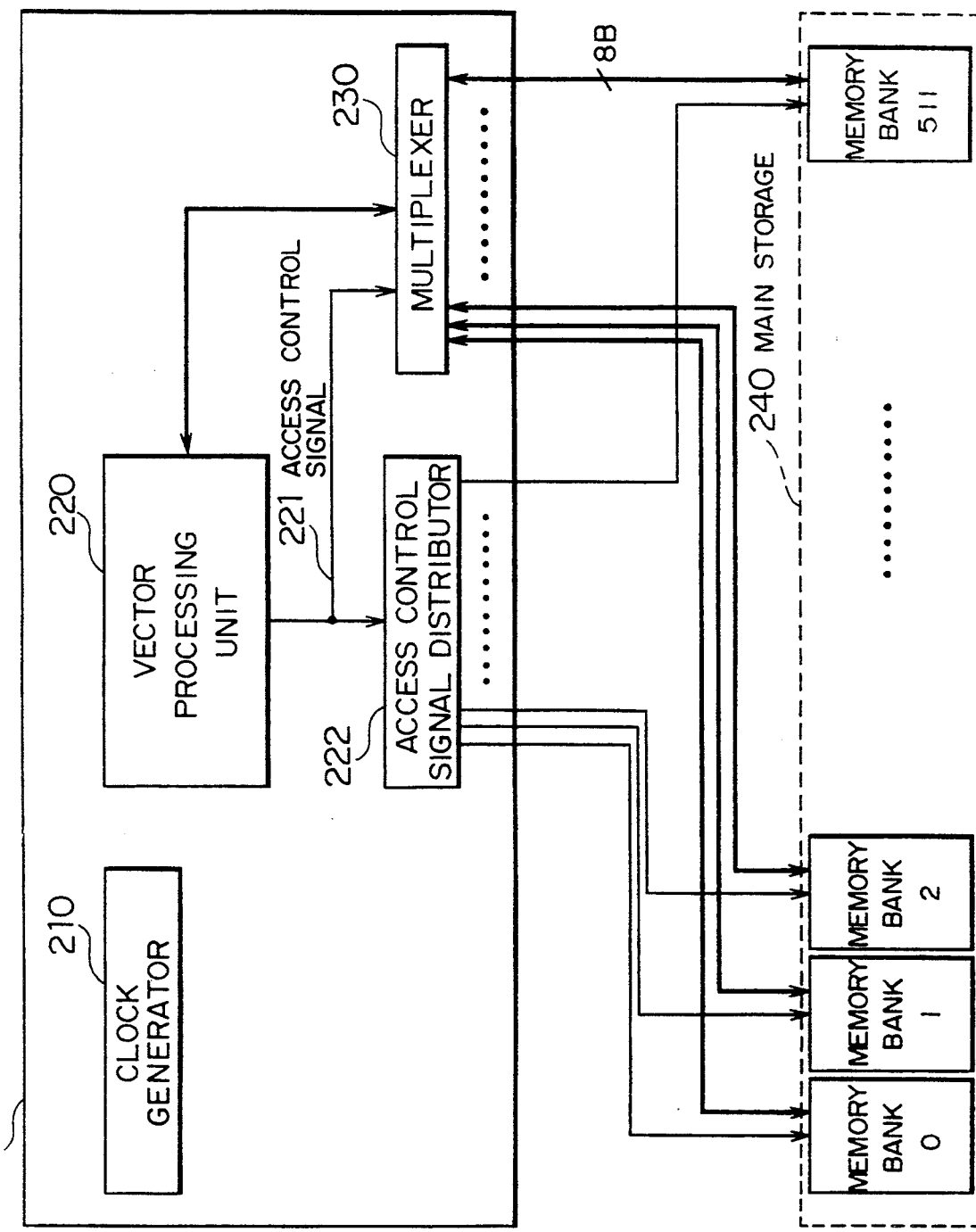
FIG. 1 is a schematic view showing an example of the construction of a vector computer.
Figure 2:
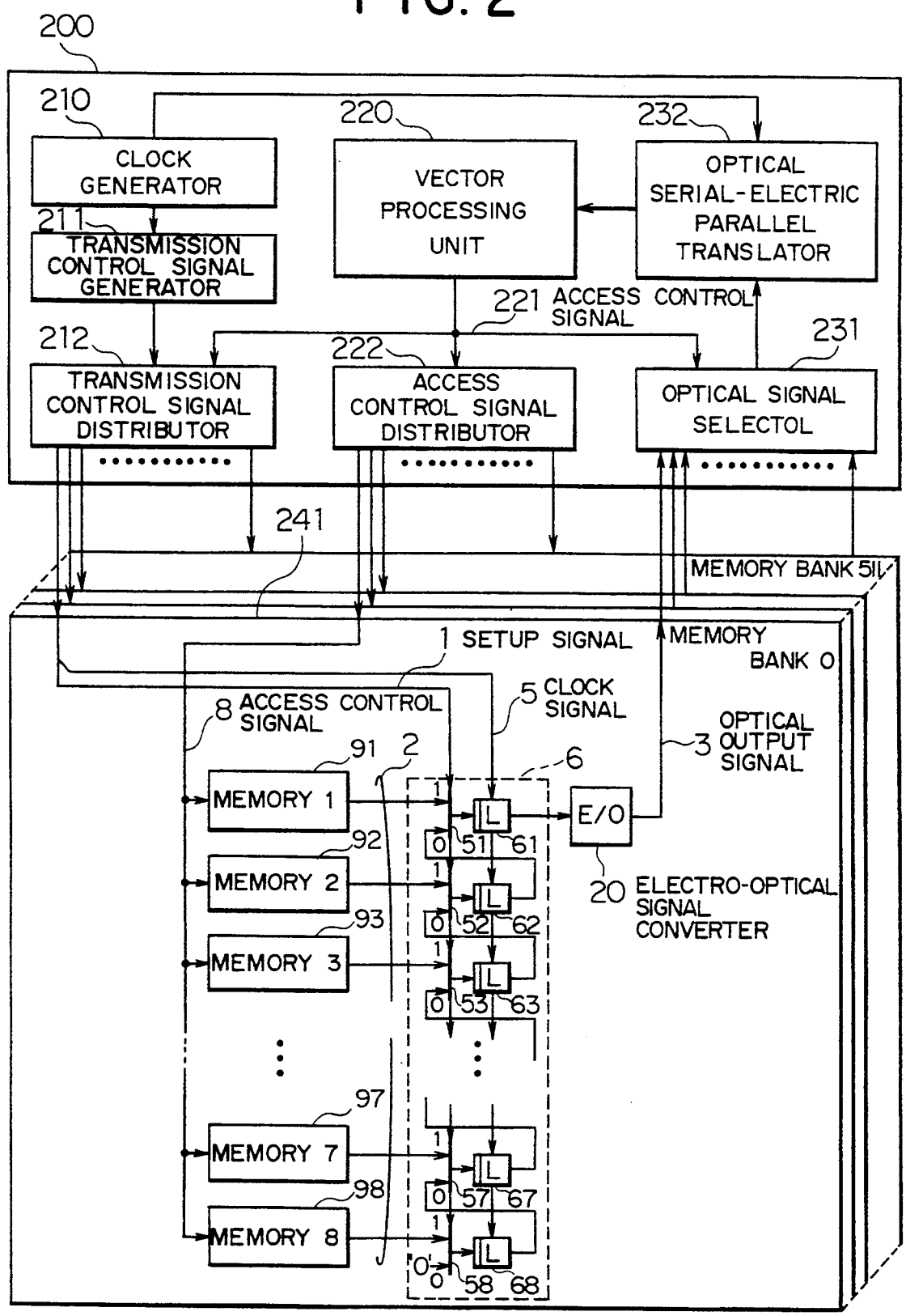
FIG. 2 is a schematic view showing an example of optical serial transmission of data read-out from a main storage according to a prior art technique.
Figure 3:
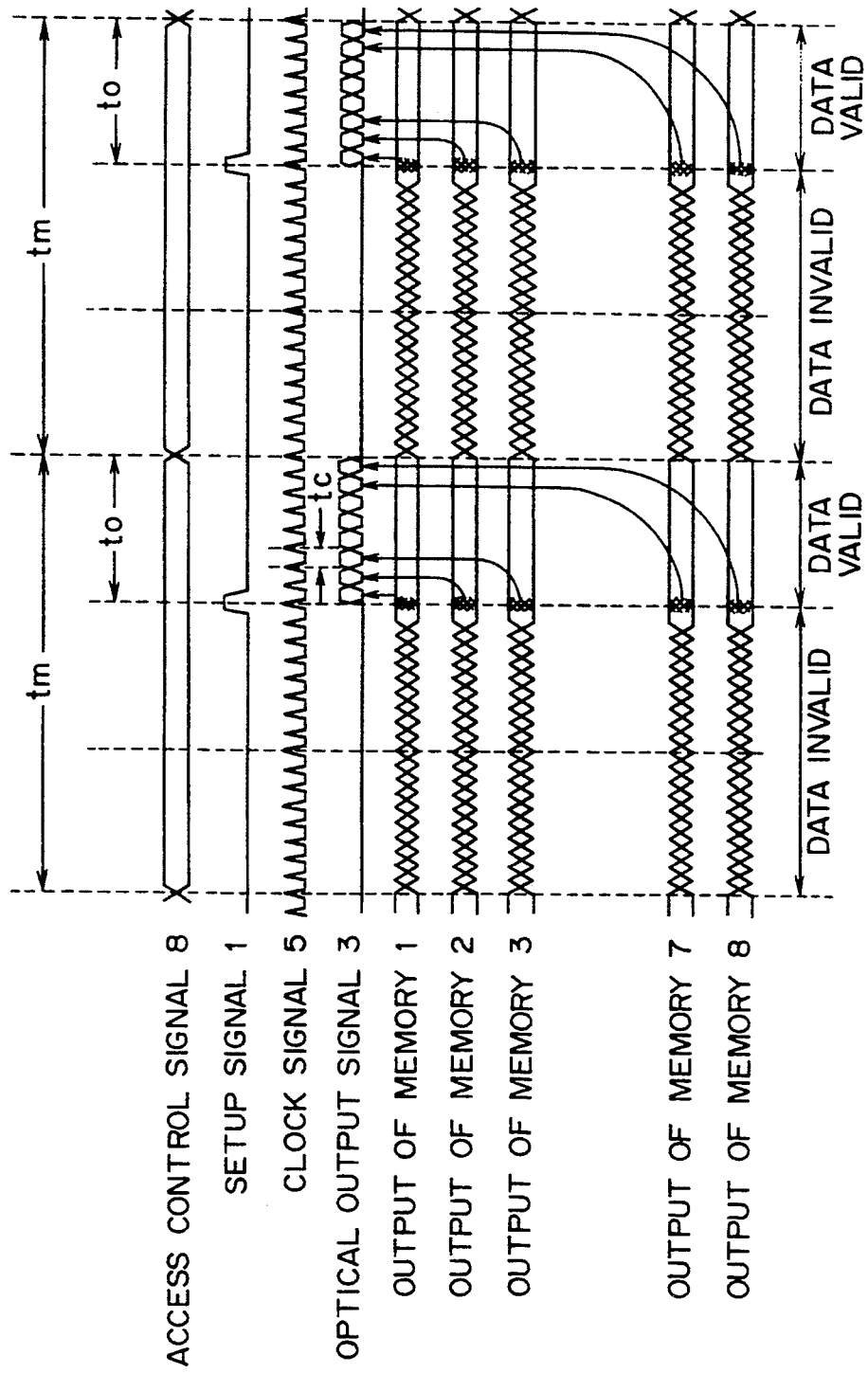
FIG. 3 is an optical serial transmission timing chart of the data read-out from the main storage according to the prior art technique.
Figure 4:
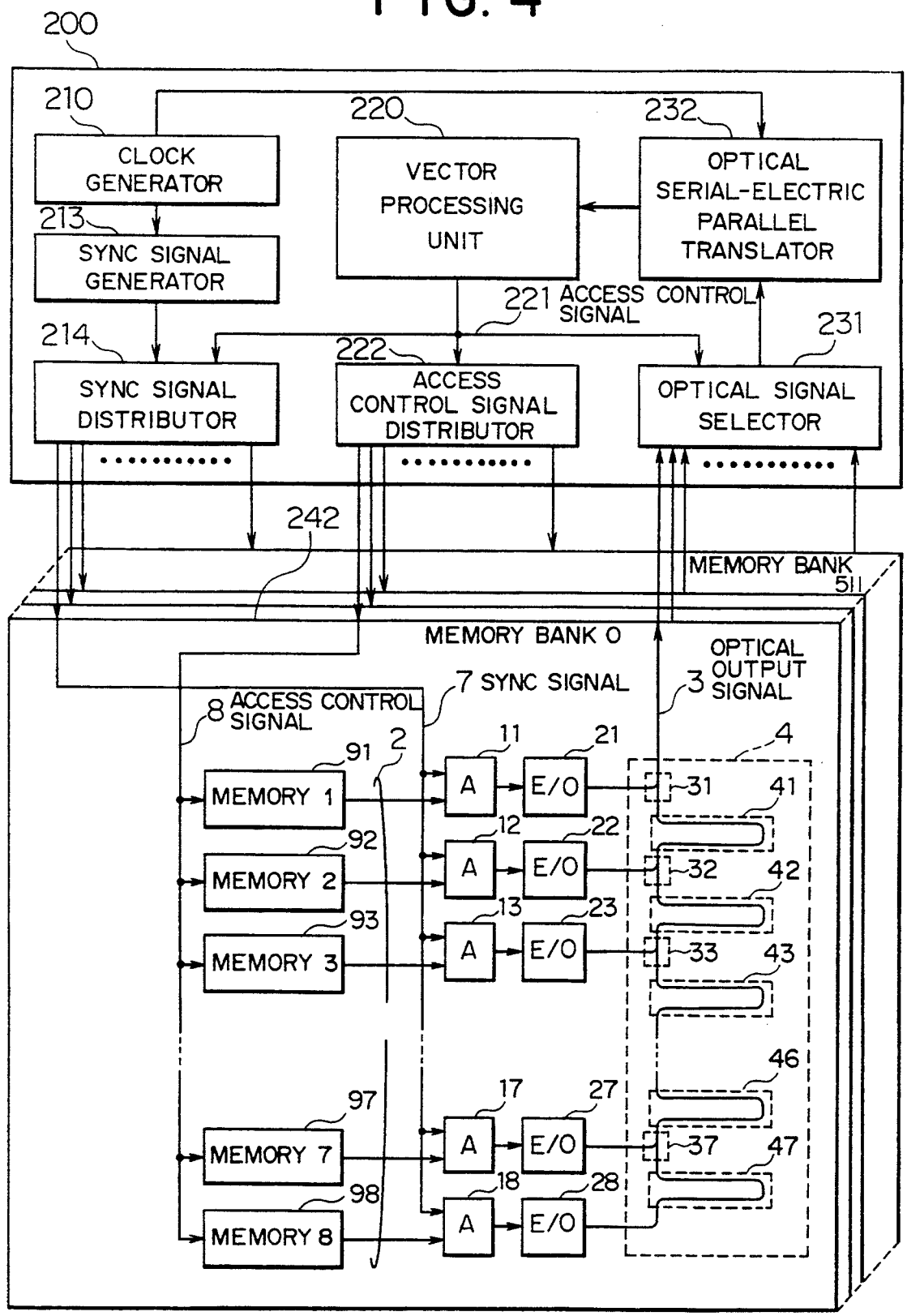
FIG. 4 is a schematic view showing a first embodiment of the vector computer using optical P/S translators.
Figure 5:
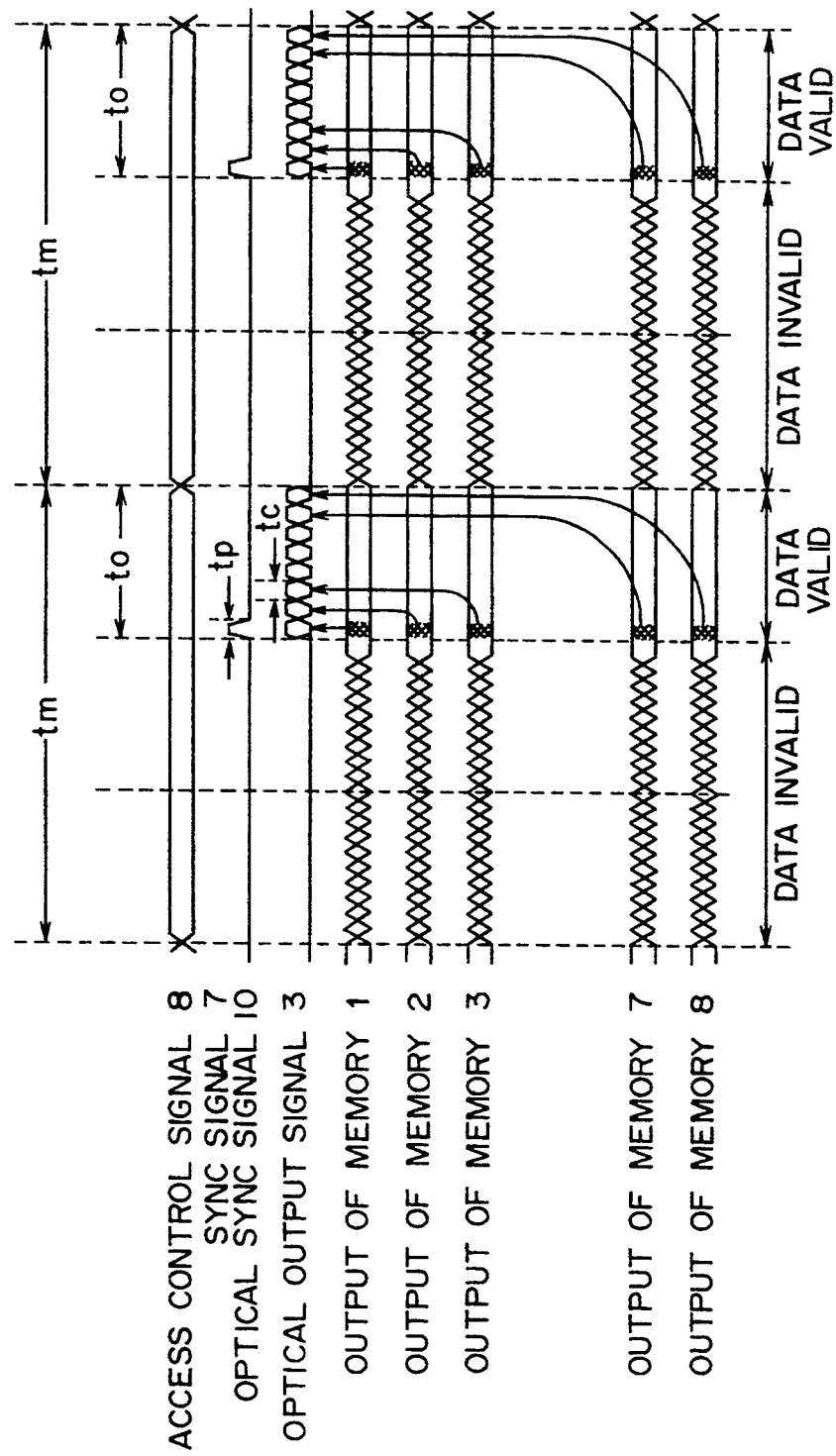
FIG. 5 is an optical serial transmission timing chart in the first and a second embodiment.
Figure 6:
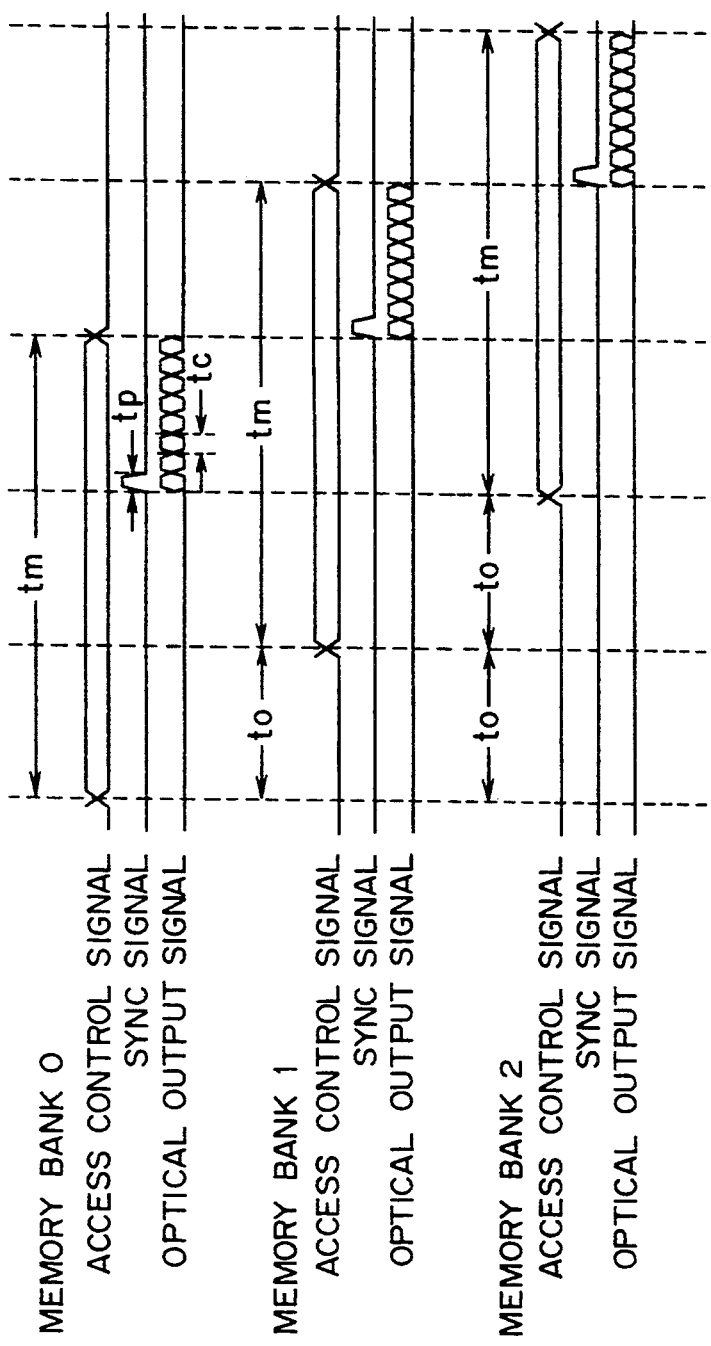
FIG. 6 is an optical serial transmission timing chart for data read-out from different memory banks.

FIG. 4 shows the first embodiment of the vector computer using the parallel-serial signal translator according to the present invention; FIG. 5 indicates operation timing of memory access processing in a memory bank; and FIG. 6 indicates transmission timing of the optical serial data read-out from different memory banks. In the present embodiment memory access is started by a access control signal 8 in the different memory banks. Electric signals outputted by memories of 8 bits and inputted in parallel are subjected to electro-optical signal conversion and optical signals are P/S translated to output a serial optical signal.

Each of data signals 2 of 8 bits are applied to one of two input terminals of each of AND gates 11 to 18. A sync signal 7 is a starting signal for the P/S translation and applied to the other input terminal of the different AND gates in common. The sync signal and the data signals are 2-level signals, effective (the signal voltage being at a high level) and ineffective (the signal voltage being at a low level). Each of the AND gates 11–18 works so as to send the sync signal to the electro-optical signal converters 21 to 28, only when the data signal is effective. The term "switching means" includes also gate means such as an AND gate. Consequently, since an AND gate can be thought to be a kind of switching means. Here, the sync signal is sent, after a period of time (tm-t0) necessary for accessing the memory after having started the memory access by the access control signal 8, in other words after the value of the data signal has been determined. For this reason, only in the case where the data signal corresponding to each of the electro-optical signal converters is effective, light is emitted-in synchronism with the sync signal.

Further, according to the present invention, in the case where signals are transmitted with a high speed, in order to reduce skew in the transfer delay of optical pulsed signals, it is preferable to use elements emitting laser light such as laser diodes for the electro-optical signal converters 21 to 28 and optical fibers for the optical waveguides.

The P/S translation for the optical signals is effected by using optical signals in the optical parallel-serial signal translators 4. The optical parallel-serial translator 4 is composed of couplers 31 to 37, each of which couples 2 injected optical signals to output them, and optical waveguides 41 to 47 for adjusting the transfer delay time serving as light delaying means delaying the optical signals by a predetermined time (tc). Here, by setting the device so that $tp \leq tc$ (if possible, tp being equal to tc times about 0.7 to 0.9), lights outputted by the different electro-optical converters are outputted through the optical waveguide 3 in the order of the data outputted by MEMORY 1 (91) to MEMORY 8 (98) without being superposed on each other. In this way the data signals inputted in parallel are translated into the serial optical signal to be outputted.

For the P/S translation translating processing is terminated in a time of t0. Here it is supposed that $tc \times$ (number of bits serially transmitted) $\leq t0$. t0 is set e.g. at a machine cycle. When the P/S translation is terminated, following memory accessing processing can be started. At this time the cycle time of the memory access is tm, tm is set e.g. at a value of t0 multiplied by an integer.

The memory banks can be operated independently from each other. For this reason, by accessing the different memory banks while shifting the time by t0 (interleave), after having read out first data after the lapse of time of tm, data can be transmitted from different memory banks for every time of t0. The number of memory banks necessary for the interleave is given by tm/t0. Although it is 3 in the embodiment, usual computer has a value thereof of 8 or 16. At this time the time t0 required for the serial transmission processing is as small as 1/7 to 1/15 of the time (tm-t0) until the data outputted by the memory are determined, which means that increase in the memory access time due to the introduction of the serial transmission is small. Further, since the speed of the vector processor is increased, every time a new model is put on the market and the increase in the speed of the memories constituting the main storage cannot follow it, it can be expected that the increase in the memory access time due to the introduction of the serial transmission decreases further in the future.

The optical parallel-serial signal translator in the present embodiment effects the P/S translation by using the transfer delay of optical signals. For this reason, in the case where the transmission bit rate should be raised, i.e. the transmission interval should be shortened, means are required for revising skew in the delay time of the sync signal, the AND gates and the electro-optical signal converters. Skew in the time, until the value of the data signal is determined, can be neglected, because sync signals are transmitted together, after the value has been determined. The sync signal is generated on the basis of the machine clock supplied to the whole computer and the skew in the time necessary for the sync signal to arrive at the relevant AND gate can be made almost 0 by effecting wiring so as to satisfy a same rule of clock signal distribution as the machine clock signal (e.g. constant wiring length, complementary signal transmitted by parallel wiring, etc.). On the other hand, the skew in the delay time of the different AND gates and electro-optical converters can be revised by varying the length of the optical waveguide for adjusting the transfer delay time. For example, the delay time, in the case where the optical waveguide is made of $SiO_2$, is about 5.0 ps/mm. Supposing that fabrication precision for the length of the optical waveguide is 0.1 mm, the delay time can be revised in unit of 0.5 ps. Even if the transmission interval of signals is 100 ps (10 Gbps), the revision can be effected satsifactorily. Further, in this case, couplers are aligned with an interval of about 20 mm, which gives rise to no hindrance to packaging.

In a prior art example, the P/S translation is effected in a step, where electric signals are used, by using a shift register 6 constituted by selectors and registers. Since the transmission interval between serial transmission signals is determined by the clock signal, it is necessary that the interval between clock signal pulses is about tc and the width of the clock signal pulses is about tc/5. As described above, in the prior art example, it is necessary to transmit the clock signal pulses having an interval and a width, which are narrower than those of the machine clock, to a number of memory banks, which makes the packaging difficult. On the other hand, in the present embodiment, the interval between the sync signal pulses may be t0 and the width of the sync signal pulses may be tp. In particular, if the shape of the machine clock signal, supplied to the whole computer is matched with the shape of the sync signal, it is not necessary to dispose wiring separately for the two kinds of signals.

As described above, the present invention has a feature that a high transmission bit rate is obtained and the P/S translation can be effected more easily in a region (about 10 Gbps), where the P/S translation is difficult for an electric circuit.

Figure 7:
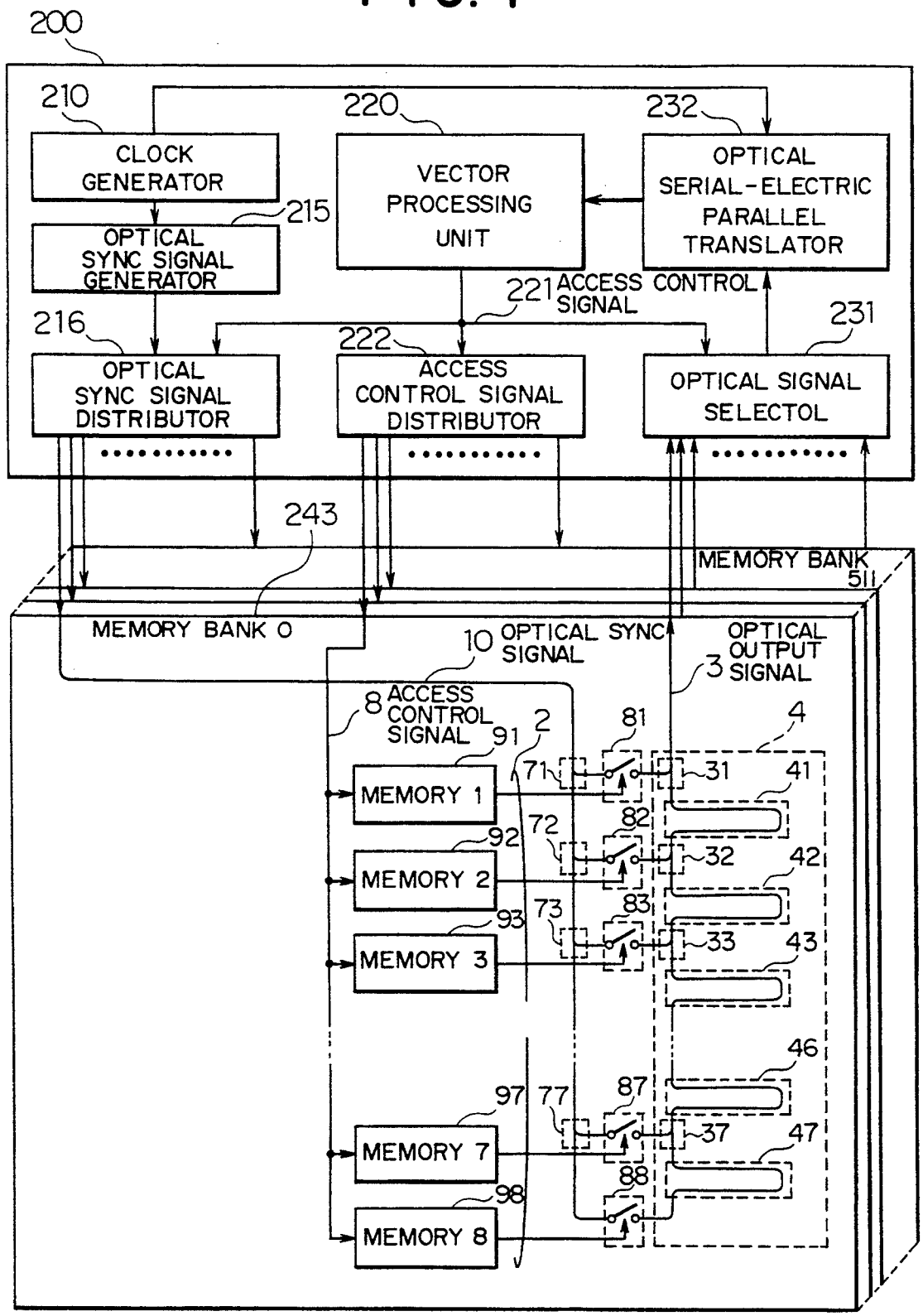
FIG. 7 is a schematic view showing the second embodiment of the vector computer using optical P/S translator.

FIG. 7 shows the second embodiment of the vector computer using the parallel-serial translator according to the present invention. The second embodiment differs from the first embodiment in that the sync signal is supplied by an optical signal and optical switches are used in lieu of the AND gates. An optical sync signal 10 is a starting signal for the P/S translation, which is divided by optical dividers 71 to 77 and applied to optical input terminals of the optical switches in common. Each of the optical switches works so as to make the optical sync signal pass through, only when the data signal 2 is effective. Here, similarly to EMBODIMENT 1, the optical sync signal is transmitted, after the value of the data signal is determined. Similarly to EMBODIMENT 1, the P/S translation of the optical signal is effected in the optical parallel-serial translator 4. As described above, in EMBODIMENT 2, data signals inputted in parallel with the same timing as in EMBODIMENT 1, are translated into a serial optical signal to be outputted.

Further, in order to reduce skew in the transfer delay of the optical pulse signal, it is preferable to use an element emitting laser light for the light source of pulsed light.

Also in the second embodiment, similarly to the first embodiment, it is necessary to revise skew in the transfer delay time of different optical transmission routes, through which the optical sync signal arrives at the optical waveguide 3, passing through different optical switches 88. This can be revised by adjusting the length of the optical waveguides for adjusting the tranfer delay time.

In the second embodiment the electro-optical signal converter is changed from the high speed light emitting elements to optical switches having a great signal bandwidth. Here attention should be paid to the fact that, since pulsed light is injected at a point of time where the transfer/cut-off of the optical switches has been determined, the switching (switching of transfer/cut-off) time of the optical switches is independent of the transmission rate of the signal. Further, according to the present invention, the interval between serial transmission signals is determined by the pulse width of the sync signal and in the second embodiment, attention should be paid to the fact that the sync signal is transmitted only through optical waveguides having a great signal bandwidth. In this way the optical sync signal is distributed without the waveform thereof becoming dull and coupled again after having passed through different optical switches. As described above, by the second embodiment, it is possible to construct more easily a parallel-serial translator having a high transmission bit rate than by the first embodiment.

Further, in the second embodiment, since it is sufficient that the difference in the transfer delay time between the different transmission routes is tc for the transmission routes, through which the optical sync signals are distributed and coupled again through the different optical switches, attention should be paid to the fact that if pulsed light is injected, while the transfer/cut-off of the optical switches is determined, the place where the optical switches are located in the course of the transmission route is arbitrary.

Figure 8:
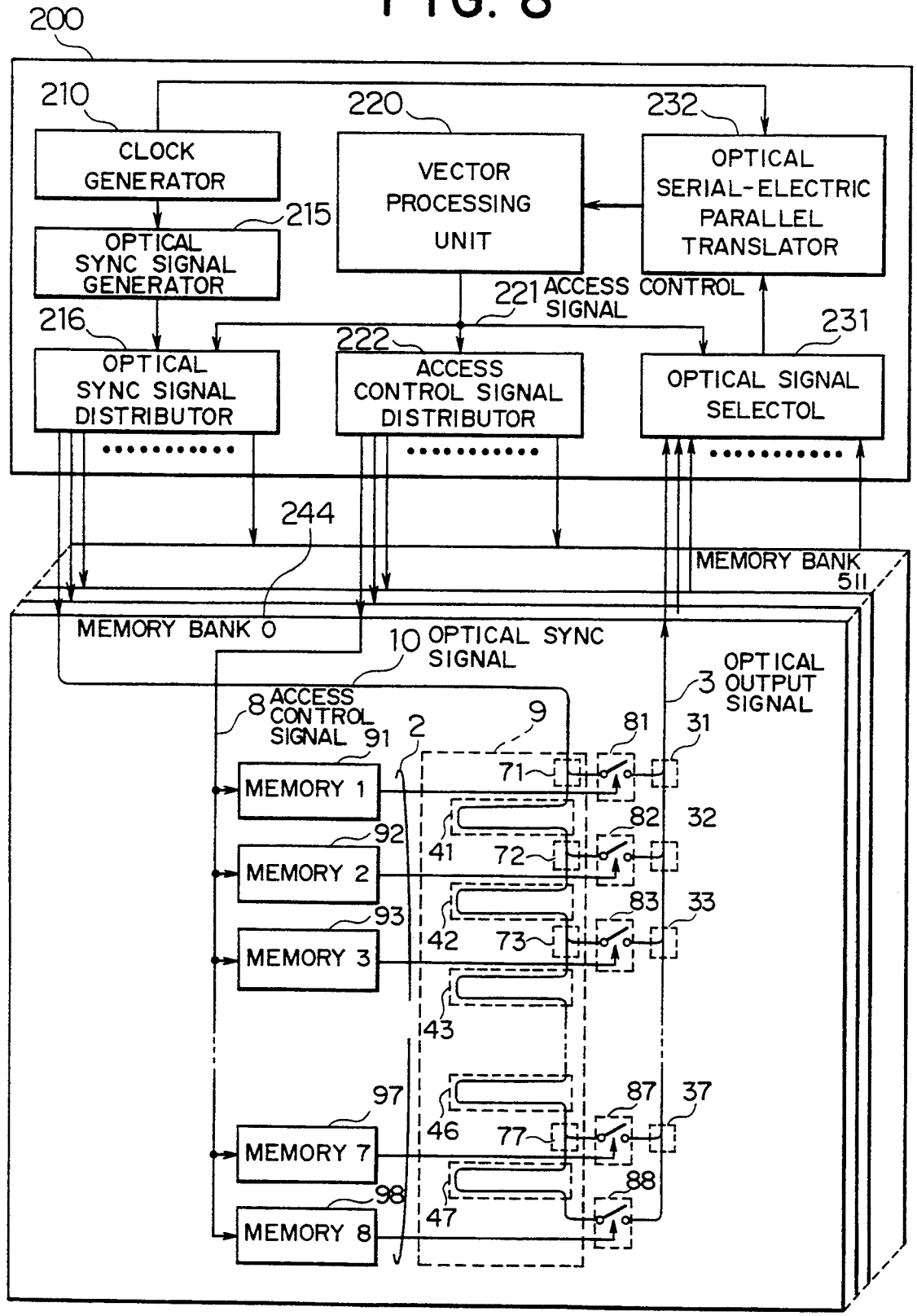
FIG. 8 is a schematic view showing the third embodiment of the vector computer using optical P/S translator.
Figure 9:
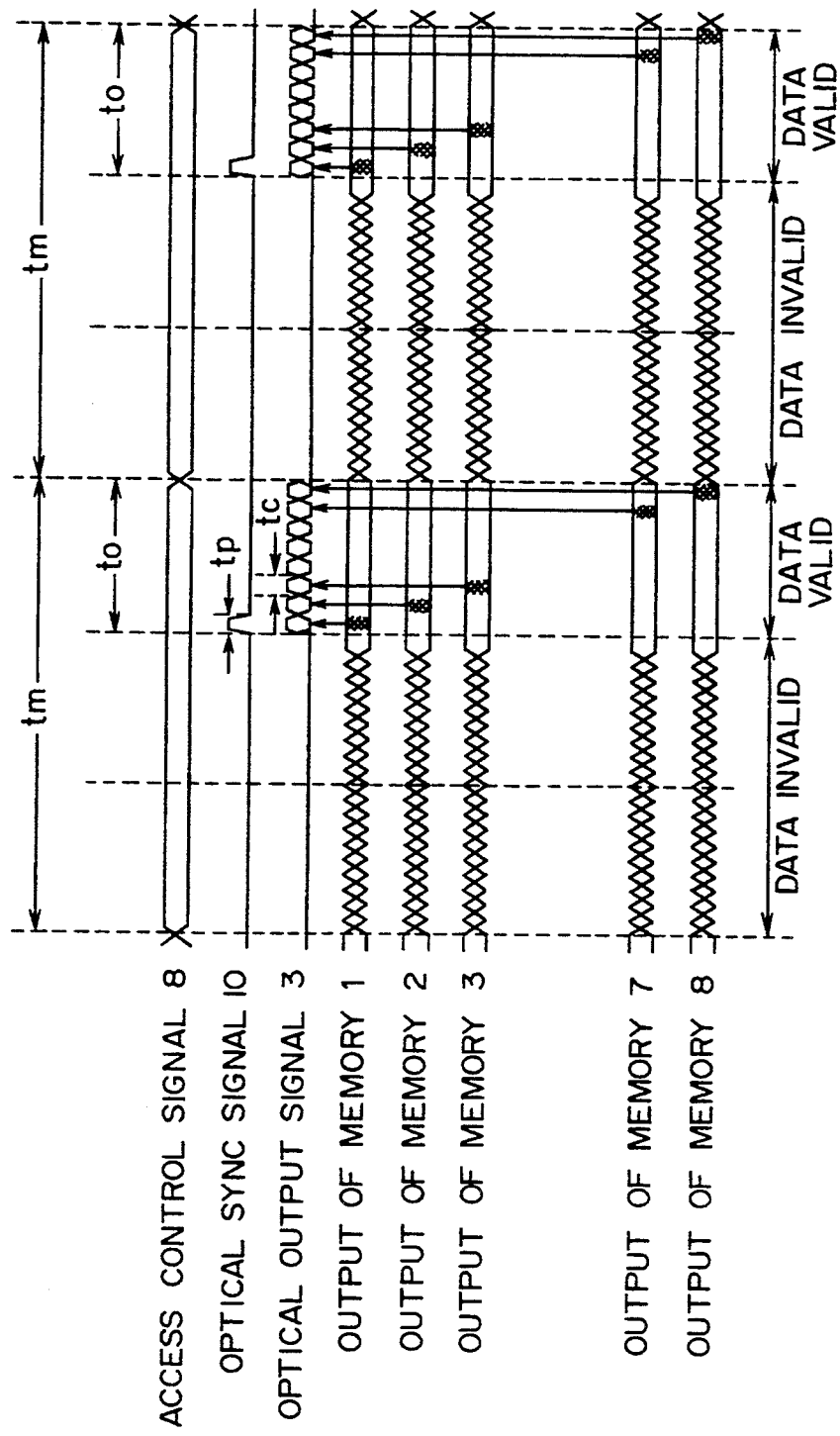
FIG. 9 is an optical serial transmission timing chart in the third embodiment.

FIG. 8 shows the third embodiment of the vector computer using the parallel-serial translator according to the present invention and FIG. 9 indicates the operation timing of the memory access processing for the memory banks. The third embodiment differs from the second embodiment in that optical waveguides 41 to 47 for adjusting the transfer delay time serving as optical delaying means delaying the optical signals by a predetermined time (tc) are disposed before the optical switches.

As described previously, if pulsed light is injected, while the transfer/cut-off of the optical switches is determined, the place where the optical switches are located in the couse of the transfer route is arbitrary. In the third embodiment, as indicated in FIG. 9, while the data signals are determined, the sync signals pass through the optical switches, for which the data signal is effective. When the condition stated previously is satisfied, the optical waveguide for adjusting the transfer delay time can be divided e.g. into two, each of which has a half transfer delay time and which are disposed before and behind the respective optical switch.

Figure 10:
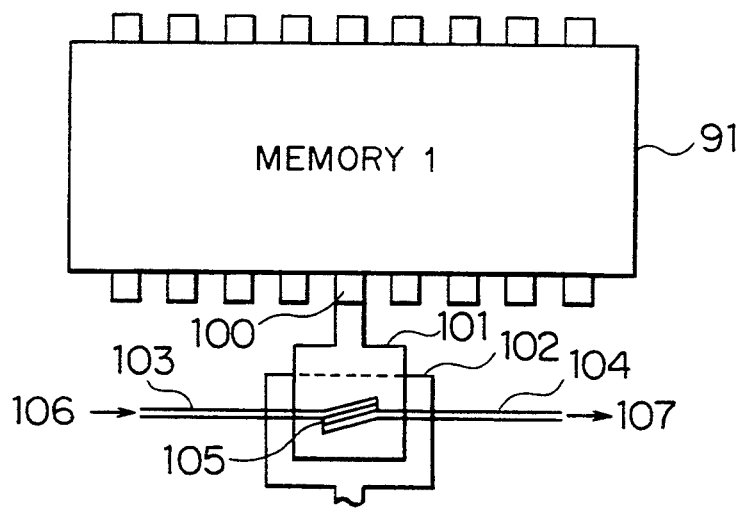
FIG. 10 is a schematic view showing an example of the construction, in which optical switches are arranged.

FIG. 10 shows an example of the construction, in which an optical switch is arranged. The optical switch is so constructed that an optical switching element 105 is put between an electrode 101 connected with a data pin 100 of a memory and a common electrode 102. An optical signal 106 is injected from either one of optical distributors 71 to 77 in the optical switching element through an optical waveguide 103. The optical switching element transfers/cuts off injected light, responding to a signal voltage supplied through the data pin. In the case where the injected light is transferred, an optical signal 107 is outputted through an optical waveguide 104 to be transmitted to a coupler. An electro-optical material such as LiNbO$_3$, etc. can be used for the optical switching element. Since the optical switch can be constructed in a form about 3 mm long, it can be formed on a board in the neighborhood of the data pin of the memory.

Figure 11A:
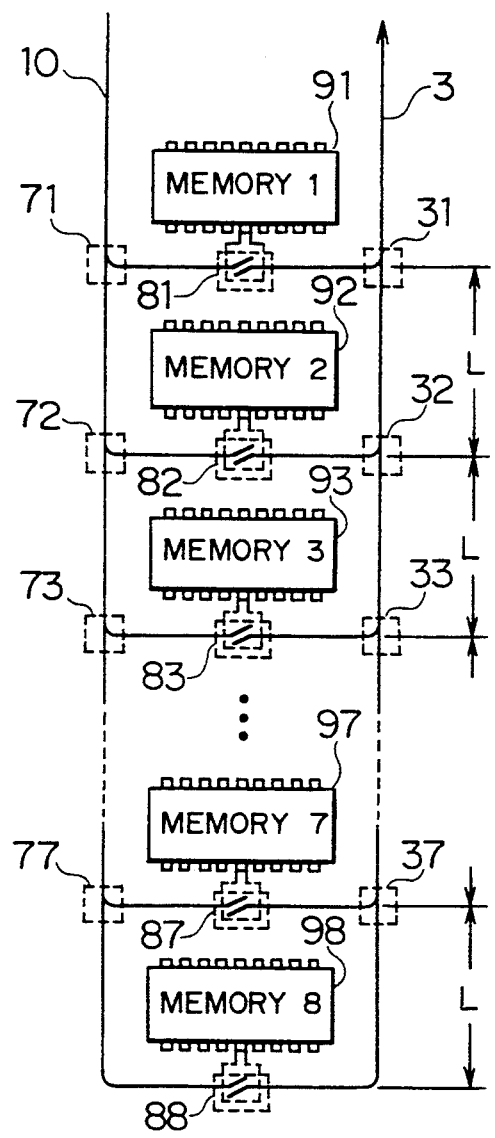
FIGS. 11A and 11B are schematic views showing example of the construction, in which optical P/S translator are arranged, utilizing the geometrical arrangement of memories.
Figure 11B:
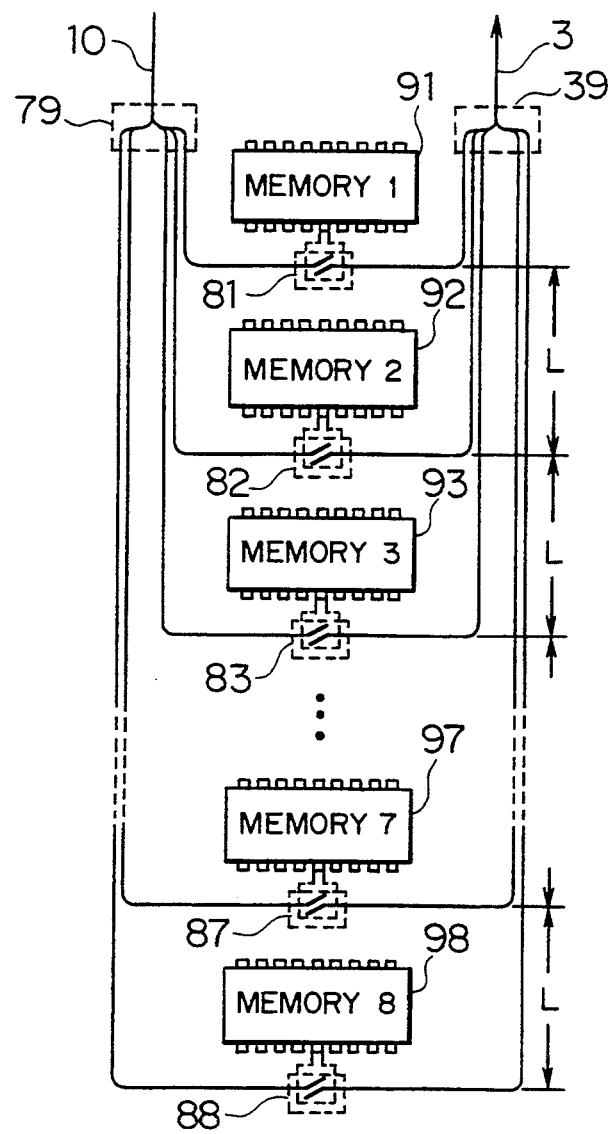

FIGS. 11A and 11B show two examples of the construction, in which an optical parallel-serial signal translator using different geometrical arrangements of memories is disposed. FIG. 11A indicates an example, in which sets, each of which includes a distributor and a coupler, are arranged with a constant interval on optical waveguides and FIG. 11B shows an example, in which the distributors and the coupler are gathered at one place. Attention should be paid to the fact that, in both of them, each of small size optical switches is located in the neighborhood of the data pin of each of memories and the length of different transmission routes, through each of which an optical sync signal passes through an optical switch, is varied 2L by 2L in accordance with the memories arranged with a constant interval. L is about 10 mm, in the case where the transmission bit rate is 10 Gbps and the optical waveguides are made of SiO$_2$. Further, since the memories can be arranged easily on a board with the interval of 10 mm, it is not necessary to form intentionally the optical waveguides for adjusting the transfer delay time.

Although, in the third embodiment, the optical waveguides for adjusting the transfer delay time are disposed before the respective optical switches, also in the first embodiment the electrical transmission line for adjusting the transfer delay time may be disposed before the respective AND gates serving as the optical switches. Further, in order to vary the transfer delay time every time by a predetermined time, different transfer delay times may be produced on the basis of machine clocks having different phases instead of the optical waveguides for adjusting the transfer delay time. In particular, if the number of bits to be P/S-translated is selected so as to be in accordance with the number of phases of the machine clock and sync signals to be applied to different AND gates are produced on the basis of the machine clocks having different phases, the sync signals to be applied to the different AND gates can be used without adjusting differences in the arrival time thereof.

Although, in the embodiments explained heretofore, explanation has been made for a parallel-serial translator of 8 bits, the number of bits is not restricted to 8, but it is a matter of course that it may be an arbitrary number of bits greater than 2.

Although, in the embodiments explained heretofore, it has been described that the sync signal is generated by a sync signal generator 213 mounted on the vector processor side and distributed to different memory banks by a sync signal distributor 214 on the basis of an access control signal, these may be replaced to the side of each memory board and the sync signal may be produced on the basis of the machine clock signal and the access control signal. The same is valid also for the optical sync signal.

The selection of the optical serial signals outputted by the different memory banks can be realized by means of an optical coupler instead of an optical selector, if the optical sync signals sent to the different memory banks are emitted, shifted t0 by t0, because while a memory bank outputs an optical serial signal, the other memory banks output no optical serial signal.

Concerning disturbance in the transmission of serial transmission data, since ECC bits for detecting and correcting the disturbance are added usually to the data stored in the memory, if the data are translated into serial data, including it, to be transmitted, and detection and correction of disturbance are effected on the vector processor side, it is unnecessary for the parallel-serial signal translator to be provided with a function of detecting and correcting disturbance.

In the parallel-serial signal translator according to the present invention, each of electric signals inputted in parallel can be used as an enable signal for switching means disposed for each of pulsed synchronizing signals for making them selectively pass through. Since each of serial optical signal data is produced by this synchronizing pulse and not by switching time of different data signals, a high speed parallel-serial translation can be realized more easily than by the prior art technique.

Since the synchronizing signal can be supplied without the waveform of pulses becoming dull by using optical switches as these switching means and distributing pulsed optical signals as synchronizing signals, a high speed parallel-serial signal translator can be easily realized.

Further, according to the present invention, since the parallel-serial translation is effected correctly, if the difference in the transfer delay time between different routes, through which the synchronizing signals are distributed and coupled again through different switching means is equal to the interval of the transmission of the optical serial signals and the value of the electric signals inputted in parallel has been determined, when the synchronizing signals pass through the switching means, the size of the parallel-serial signal translator can be reduced, if the arrangement of the distributor, the switching means, the coupler and the routes producing time differences in the synchronizing signals is matched with the geometrical arrangement of integrated circuit mounted on the board. In particular, in the case where optical switches are used for the switching means and optical pulse signals are used for the synchronizing signals, it is possible to form all the distributor, the optical switches, the coupler and the routes producing the time differences in the synchronizing signals on one board, and since it is unnecessary to form intentionally the routes producing the time differences, the size of the parallel-serial signal translator can be reduced.

I claim:

1. A parallel-serial signal converting apparatus, comprising:
a plurality of switch means each having a control terminal which is used to control ON and OFF states of said switch means in response to an electric data signal representing a parallel data bit, wherein said switch means when in said ON state permits a signal to pass through and when in said OFF state does not permit a signal to pass through;
a plurality of electro-optical converting means connected to output terminals of said plurality of switch means, respectively;
means for distributing a single pulsed electrical synchronizing signal to said plurality of switch means;

at least one optical delay means connected to output terminals of said electro-optical converting means, each thereof causing an incoming optical signal corresponding to said electrical synchronizing signal to be delayed by a predetermined time longer than a pulse width of said electrical synchronizing signal by utilizing an optical delaying property; and optical coupling means connected to an output terminal of said at least one optical delay means, for coupling said optical signals corresponding to said electrical synchronizing signal passing substantially simultaneously through said respective switch means in said ON state to produce a serial optical pulse signal.

2. A parallel-serial signal converting apparatus according to claim 1, wherein said plurality of switch means each includes an AND gate.

3. A parallel-serial signal converting apparatus, comprising:

a plurality of switch means each having a control terminal which is used to control ON and OFF states of said switch means in response to an electric data signal representing a parallel data bit, wherein said switch means when in said ON state permits a signal to pass through and when in said OFF state does not permit a signal to pass through;

means for distributing a single pulsed optical synchronizing signal to said plurality of switch means;

at least one optical delay means connected to output terminals of said plurality of switch means, each thereof causing said optical synchronizing signal to be delayed by a predetermined time longer than a pulse width of said optical synchronizing signal by utilizing an optical delaying property; and optical coupling means connected to an output terminal of said at least one optical delay means, for coupling said optical synchronizing signals passing substantially simultaneously through said respective switch means in said ON state to produce a serial optical pulse signal.

4. A parallel-serial signal converting apparatus according to claim 3, wherein said plurality of switch means each includes an optical switch.

5. A parallel-serial signal converting apparatus, comprising:

a plurality of switch means each having a control terminal which is used to control ON and OFF states of said switch means in response to an electric data signal representing a parallel data bit, wherein said switch means when in said ON state permits a signal to pass through and when in said OFF state does not permit a signal to pass through;

means for distributing a single pulsed optical synchronizing signal to said plurality of switch means;

at least one optical delay means connected to input terminals of said plurality of switch means, each thereof causing said optical synchronizing signal to be delayed by a predetermined time longer than a pulse width of said optical synchronizing signal by utilizing an optical delaying property; and optical coupling means connected to output terminals of said plurality of switch means, for coupling said optical synchronizing signals passing with time difference through said respective switch means in said ON state to produce a serial optical pulse signal.

6. A parallel-serial signal converting apparatus, according to claim 5, wherein said plurality of switch means each includes an optical switch.

7. A parallel-serial signal converting apparatus according to claim 5, wherein said optical delay means include a plurality of optical fibers having a common input terminal and delay times successively increasing by a unit delay time.

8. A parallel-serial signal converting apparatus according to claim 5, wherein said optical delay means include a plurality of optical fibers connected in series, each thereof having a unit delay time.

9. A parallel-serial signal converting apparatus, comprising:

a plurality of switch means each having a control terminal which is used to control ON and OFF states of said switch means in response to an electric data signal representing a parallel data bit, wherein said switch means when in said ON state permits a signal to pass through and when in said OFF state does not permit a signal to pass through;

means for distributing a single pulsed optical synchronizing signal to said plurality of switch means;

at least one pair of optical delay means connected to input and output terminals of said plurality of switch means, each thereof causing said optical synchronizing signal to be delayed by a predetermined time longer than a pulse width of said optical synchronizing signal by utilizing an optical delaying property; and optical coupling means connected to said at least one pair of optical delay means on an output side of said plurality of switch means, for coupling said optical synchronizing signals passing with time difference through said respective switch means in said ON state to produce a serial optical pulse signal.

10. A parallel-serial signal converting apparatus according to claim 9, wherein said plurality of switch means each includes an optical switch.

11. A parallel-serial signal converting apparatus according to claim 9, wherein said plurality of electric data signals representing parallel data bits are outputted from semiconductor elements aligned with substantially equal spacing on a circuit board, and said optical delay means include optical fibers routed on said board substantially perpendicular to the alignment of said semiconductor elements.

12. A parallel-serial signal converting apparatus according to claim 9, wherein said optical delay means include a plurality of optical fibers having a common input terminal and delay times successively increasing by a unit delay time.

13. A parallel-serial signal converting apparatus according to claim 9, wherein said optical delay means include a plurality of optical fibers connected in series, each thereof having a unit delay time.

14. A parallel-serial signal converting apparatus according to claim 9, wherein said optical delay means include a plurality of optical fibers having a common input terminal and delay times successively increasing by a unit delay time.

15. A parallel-serial signal converting apparatus according to claim 9, wherein said optical delay means include a plurality of optical fibers connected in series, each thereof having a unit delay time.

16. A computer system according to claim 9, wherein said plurality of electric data signals representing parallel data bits are outputted from semiconductor elements aligned with substantially equal spacing on a circuit board, and said optical delay means include optical fibers routed on said board substantially perpendicular to the alignment of said semiconductor elements.

17. A computer system according to claim 16, wherein said optical delay means include a plurality of optical fibers having a common input terminal and delay times successively increasing by a unit delay time.

18. A computer system according to claim 16, wherein said optical delay means include a plurality of optical fibers connected in series, each thereof having a unit delay time.

19. A computer system, comprising:
a storage having a plurality of memory banks;
a processing unit;
a parallel-serial converting unit provided in each of said memory banks;
means responsive to an access control signal outputted from said processing unit, for selecting a serial optical output signal from one of said plurality of memory banks; and
means for converting the selected serial optical output signal into parallel electric signals to supply them to said processing unit;
wherein each of said parallel-serial signal converting units includes:
memory means responsive to the access control signal, for outputting a plurality of electric data signals representing parallel data bits;
a plurality of switch means connected to said memory means, each switch means having a control terminal which is used to control ON and OFF states of said switch means in response to an electric data signal representing a parallel data bit, wherein said switch means when in said ON state permits a signal to pass through and when in said OFF state does not permit a signal to pass through;
a plurality of electro-optical converting means connected to output terminals of said plurality of switch means, respectively;
means for distributing a single pulsed electrical synchronizing signal to said plurality of switch means on the basis of system clocks of said processing unit;
at least one optical delay means connected to output terminals of said electro-optical converting means, each thereof causing an incoming optical signal corresponding to said electrical synchronizing signal to be delayed by a predetermined time longer than a pulse width of said electrical synchronizing signal by utilizing an optical delaying property; and
optical coupling means connected to an output terminal of said at least one optical delay means, for coupling said optical signals corresponding to said electrical synchronizing signal passing substantially simultaneously through said respective switching means in said ON state to produce the serial optical pulse signal.

20. A computer system according to claim 19, wherein said plurality of switch means each includes an AND gate.

21. A computer system according to claim 19, wherein a multiplication of the pulse width and the number of bits of said serial optical output signal is not longer than a machine cycle of said processing unit.

22. A computer system according to claim 19, wherein an interval of said synchronizing signals is equal to a machine cycle of said processing unit multiplied by an integer.

23. A computer system, comprising:
a storage having a plurality of memory banks;
a processing unit;
a parallel-serial converting unit provided in each of said memory banks;
means responsive to an access control signal outputted from said processing unit, for selecting a serial optical output signal from one of said plurality of memory banks; and
means for converting the selected serial optical output signal into parallel electric signals to supply them to said processing unit;
wherein each of said parallel-serial signal converting units includes:
memory means responsive to the access control signal, for outputting a plurality of electric data signals representing parallel data bits;
a plurality of switch means connected to said memory means, each switch means having a control terminal which is used to control ON and OFF states of said switch means in response to an electric data signal, wherein said switch means when in said ON state permits a signal to pass through and when in said OFF state does not permit a signal to pass through;
means for distributing a single pulsed optical synchronizing signal to said plurality of switch means on the basis of system clocks of said processing unit;
at least one optical delay means connected to output terminals of said plurality of switch means, each thereof causing said optical synchronizing signal to be delayed by a predetermined time longer than a pulse width of said optical synchronizing signal by utilizing an optical delaying property; and
optical coupling means connected to an output terminal of said at least one optical delay means, for coupling said optical synchronizing signals passing substantially simultaneously through said respective switch means in an ON state to produce the serial optical pulse signal.

24. A computer system according to claim 23, said plurality of switch means each includes an optical switch.

25. A computer system according to claim 23, wherein a multiplication of the pulse width and the number of bits of said serial optical output signal is not longer than a machine cycle of said processing unit.

26. A computer system according to claim 23, wherein an interval of said synchronizing signals is equal to a machine cycle of said processing unit multiplied by an integer.

27. A computer system according to claim 23, wherein an interval of said synchronizing signals is longer than a length of said serial optical output signal outputted from said optical coupling means.

28. A computer system, comprising:
a storage having a plurality of memory banks;
a processing unit;
a parallel-serial converting unit provided in each of said memory banks;
means responsive to an access control signal outputted from said processing unit, for selecting a serial optical output signal from one of said plurality of memory banks; and means for converting the selected serial optical output signal into parallel electric signals to supply them to said processing unit;

wherein each of said parallel-serial signal converting units includes:

memory means responsive to the access control signal, for outputting a plurality of electric data signals representing parallel data bits;

a plurality of switching means each having a control terminal which is used to control ON and OFF states of said switch means in response to an electric data signal, wherein said switch means when in said ON state permits a signal to pass through and when in said OFF state does not permit a signal to pass through;

means for distributing a single pulsed optical synchronizing signal to said plurality of switch means on the basis of system clocks of said processing unit;

at least one optical delay means connected to input terminals of said plurality of switch means, each thereof causing said optical synchronizing signal to be delayed by a predetermined time longer than a pulse width of said optical synchronizing signal by utilizing an optical delaying property; and optical coupling means connected to output terminals of said plurality of switch means, for coupling said optical synchronizing signals passing with time difference through said respective switch means in said ON state to produce the serial optical pulse signal.

29. A computer system according to claim 28, said plurality of switch means each includes an optical switch.

30. A computer system according to claim 28, wherein a multiplication of the pulse width and the number of bits of said serial optical output signal is not longer than a machine cycle of said processing unit.

31. A computer system according to claim 28, wherein an interval of said synchronizing signals is equal to a machine cycle of said processing unit multiplied by an integer.

32. A computer system according to claim 28, wherein an interval of said synchronizing signals is longer than a length of said serial optical output signal outputted from said optical coupling means.

33. A computer system, comprising:

a storage having a plurality of memory banks;

a processing unit;

a parallel-serial converting unit provided in each of said memory banks;

means responsive to an access control signal outputted from said processing unit, for selecting a serial optical output signal from one of said plurality of memory banks; and converting means for converting the selected serial optical output signal into parallel electric signals to supply them to said processing unit;

wherein each of said parallel-serial signal converting units includes:

memory means responsive to the access control signal, for outputting a plurality of electric data signals representing parallel data bits;

a plurality of switching means each having a control terminal which is used to control ON and OFF states of said switch means in response to an electric data signal, wherein said switch means when in said ON state permits a signal to pass through and when in said OFF state does not permit a signal to pass through;

means for distributing a single pulsed optical synchronizing signal to said plurality of switch means on the basis of system clocks of said processing unit;

at least one pair of optical delay means connected to input and output terminals of said plurality of switch means, each thereof causing said optical plurality of switch means, each thereof causing said optical synchronizing signal to be delayed by a predetermined time longer than a pulse width of said optical synchronizing signal by utilizing an optical delaying property; and optical coupling means connected to said at least one pair of optical delay means on an output side of said switch means, for coupling said optical synchronizing signals passing with time difference through said respective switch means in said ON state to produce the serial optical pulse signal.

34. A computer system according to claim 33, wherein said plurality of switch means each includes an optical switch.

35. A computer system according to claim 33, wherein said optical delay means include a plurality of optical fibers having a common input terminal and delay times successively increasing by a unit delay time.

36. A computer system according to claim 33, wherein said optical delay means include a plurality of optical fibers connected in series, each thereof having a unit delay time.

37. A computer system according to claim 33, wherein a multiplication of the pulse width and the number of bits of said serial optical output signal is not longer than a machine cycle of said processing unit.

38. A computer system according to claim 33, wherein an interval of said synchronizing signals is equal to a machine cycle of said processing unit multiplied by an integer.

39. A computer system according to claim 33, wherein an interval of said synchronizing signals is longer than a length of said serial optical output signal outputted from said optical coupling means.

* * * * *